US009479131B2

(12) United States Patent
Youssef et al.

(10) Patent No.: US 9,479,131 B2
(45) Date of Patent: Oct. 25, 2016

(54) CARRIER AGGREGATION AMPLIFIER WITH DUAL GAIN CONTROL

(71) Applicant: QUALCOMM Incorporated, San Diego, CA (US)

(72) Inventors: Ahmed Abdel Monem Youssef, San Diego, CA (US); Ehab Ahmed Sobhy Abdel Ghany, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 3 days.

(21) Appl. No.: 14/643,854

(22) Filed: Mar. 10, 2015

(65) Prior Publication Data

US 2015/0341007 A1 Nov. 26, 2015

Related U.S. Application Data

(60) Provisional application No. 62/002,751, filed on May 23, 2014.

(51) Int. Cl.

| H03G 3/30  | (2006.01) |
|---|---|
| H03F 3/19  | (2006.01) |
| H03F 3/68  | (2006.01) |
| H03G 1/00  | (2006.01) |
| H04B 1/00  | (2006.01) |
| H03F 1/22  | (2006.01) |
| H03F 3/193 | (2006.01) |

(52) U.S. Cl.
CPC ............ *H03G 3/3036* (2013.01); *H03F 1/223* (2013.01); *H03F 3/19* (2013.01); *H03F 3/193* (2013.01); *H03F 3/68* (2013.01); *H03G 1/0029* (2013.01); *H04B 1/0053* (2013.01); *H03F 2200/111* (2013.01); *H03F 2200/294* (2013.01); *H03F 2200/451* (2013.01); *H03F 2200/489* (2013.01)

(58) Field of Classification Search
CPC .............................. H03G 3/30; H03G 3/3036
USPC ............... 330/133, 134, 283, 285; 455/251.1
See application file for complete search history.

(56) References Cited

U.S. PATENT DOCUMENTS 5,867,063 A * 2/1999 Snider .................. H03G 3/3068
330/133
7,426,376 B2 9/2008 Srinivasan et al.
(Continued)

OTHER PUBLICATIONS

International Search Report and Written Opinion for International Application No. PCT/US2015/030327, ISA/EPO, Date of Mailing Jul. 16, 2015, 12 pages.

*Primary Examiner* — Steven J Mottola
(74) *Attorney, Agent, or Firm* — Toler Law Group, PC

(57) ABSTRACT

An apparatus includes a first amplification stage configured to amplify a first carrier signal and a second amplification stage configured to amplify a second carrier signal. The first amplification stage is direct-current (DC) coupled to the second amplification stage. First circuitry is coupled to the first amplification stage and configured to control a first gain of the first amplification stage. The first circuitry includes a first gain control transistor configured to selectively divert a first bleed current from a first output of the first amplification stage. Second circuitry is coupled to the second amplification stage and configured to control a second gain of the second amplification stage independently of the first gain. The second circuitry includes a second gain control transistor configured to selectively divert a second bleed current from a second output of the second amplification stage.

20 Claims, 5 Drawing Sheets

(56) References Cited

U.S. PATENT DOCUMENTS

| | | |
|---|---|---|
| 7,705,682 B2 | 4/2010 | Gao et al. |
| 7,917,117 B2 | 3/2011 | Zafonte et al. |
| 8,175,566 B2 | 5/2012 | Tasic et al. |
| 8,203,388 B2 * | 6/2012 | Kathiresan ............ G06F 1/3287 330/283 |
| 8,531,238 B2 | 9/2013 | Killat |
| 8,903,343 B2 | 12/2014 | Holenstein et al. |
| 2007/0259638 A1 * | 11/2007 | Kim .................. H03G 1/04 455/251.1 |
| 2012/0025911 A1 | 2/2012 | Zhao et al. |
| 2013/0315348 A1 | 11/2013 | Tasic et al. |
| 2013/0316670 A1 | 11/2013 | Tasic et al. |
| 2014/0113578 A1 | 4/2014 | Xu et al. |
| 2014/0134960 A1 | 5/2014 | Tasic et al. |
| 2014/0240048 A1 | 8/2014 | Youssef et al. |
| 2014/0348274 A1 | 11/2014 | Youssef et al. |

* cited by examiner

CARRIER AGGREGATION AMPLIFIER WITH DUAL GAIN CONTROL

I. CROSS-REFERENCE TO RELATED APPLICATIONS

The present application claims priority from U.S. Provisional Patent Application No. 62/002,751, filed May 23, 2014 and entitled "LOW NOISE AMPLIFIER (LNA) WITH SINGLE-ELEMENT INPUT MATCHING AND DUAL GAIN CONTROL," the content of which is incorporated by reference in its entirety.

II. FIELD

The present disclosure relates generally to electronics, and more specifically to transmitters and receivers.

III. DESCRIPTION OF RELATED ART

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover information contained in the communication signal. The transceiver also includes circuitry that enables the transmission of a communication signal to a receiver in another transceiver. The transceiver may be able to operate over multiple frequency ranges, typically referred to as frequency bands. Moreover, a single transceiver may be configured to operate using multiple carrier signals that may be in the same frequency band, but that may not overlap in frequency, an arrangement referred to as non-contiguous carriers.

In some instances, a single transmitter or receiver is configured to operate using multiple transmit frequencies and/or multiple receive frequencies. For a receiver to be able to simultaneously receive two or more receive signals, two or more receive paths may be concurrently operated. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate carrier signals in the same communication band. Inter-band carrier aggregation refers to the processing of two separate carrier signals that are in different communication bands.

A receiver architecture may use multiple LNAs to support simultaneous downlink channels. The LNA inputs may be connected together to reduce the number of radio frequency (RF) connections used to interface with a transceiver. The LNAs may operate both stand-alone and simultaneously. Stand-alone operation refers to operating on a single carrier signal at a time; and simultaneous operation refers to operating on two or more carrier signals simultaneously. The outputs of the LNAs are separated to provide isolation between the different downlink channels. The LNAs may exhibit a degraded noise figure (NF) when simultaneously operating on multiple carriers as compared to when operating independently on a single carrier due to degradation of input matching and/or noise coupling between different signal paths when simultaneously operating on multiple carriers.

IV. BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

V. DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may include files that are not executable in nature, such as documents that may need to be opened or other data files that need to be accessed.

The term "content" may include files having executable content, such as: object code, scripts, byte code, markup language files, and patches. In addition, "content" referred to herein, may also include files that are not executable in nature, such as documents that may need to be opened or other data files that need to be accessed.

As used herein, the term "stand-alone operation" refers to an amplifier, such as a low noise amplifier (LNA), operating on a single carrier signal at a time, and the term "simultaneous operation" refers to an amplifier, such as an LNA, operating on two or more carrier signals simultaneously.

Figure 1:
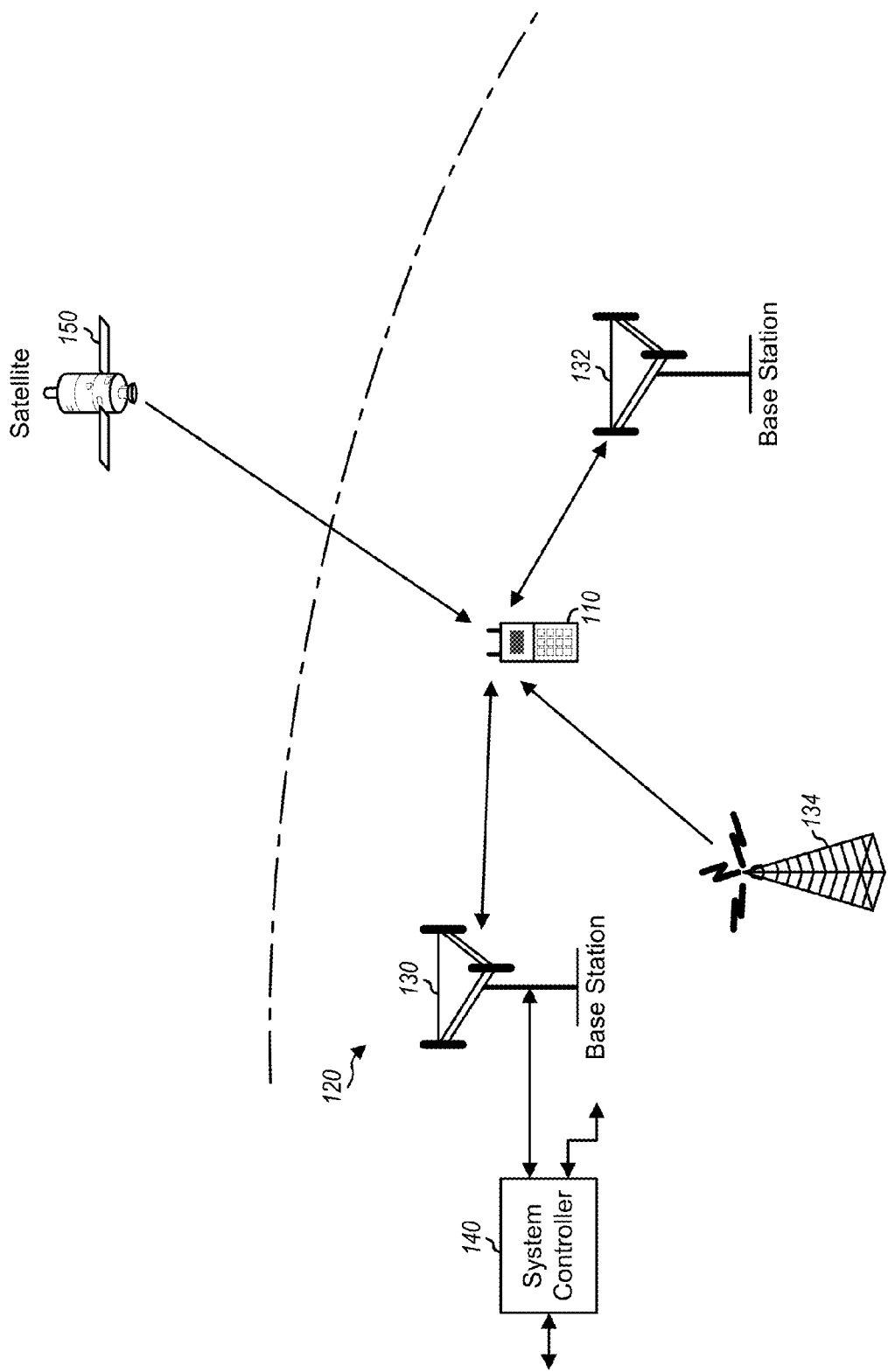
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which includes operation on multiple carriers. Carrier aggregation may also be referred to as multi-carrier operation. Wireless device 110 may be able to operate in a low-band (LB) frequency band group (e.g., a "band group" of one or more frequency bands in which a highest frequency included in the one or more frequency bands does not exceed 1000 megahertz (MHz)), a mid-band (MB) frequency band group (e.g., a band group of one or more frequency bands in which a lowest frequency included in the one or more frequency bands exceeds 1000 MHz and in which a highest frequency included in the one or more frequency bands does not exceed 2300 MHz), and/or high-band (HB) frequency band group (e.g., a band group of one or more frequency bands in which a lowest frequency included in the one or more frequency bands exceeds 2300 MHz). For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). In some implementations, each band may have a bandwidth that is smaller than or equal to 200 MHz and may include one or more carriers. Each carrier may cover up to 20 MHz in LTE. LTE Release 11 supports 35 bands, which are referred to as LTE/UMTS bands and are listed in 3GPP TS 36.101.

Figure 4:
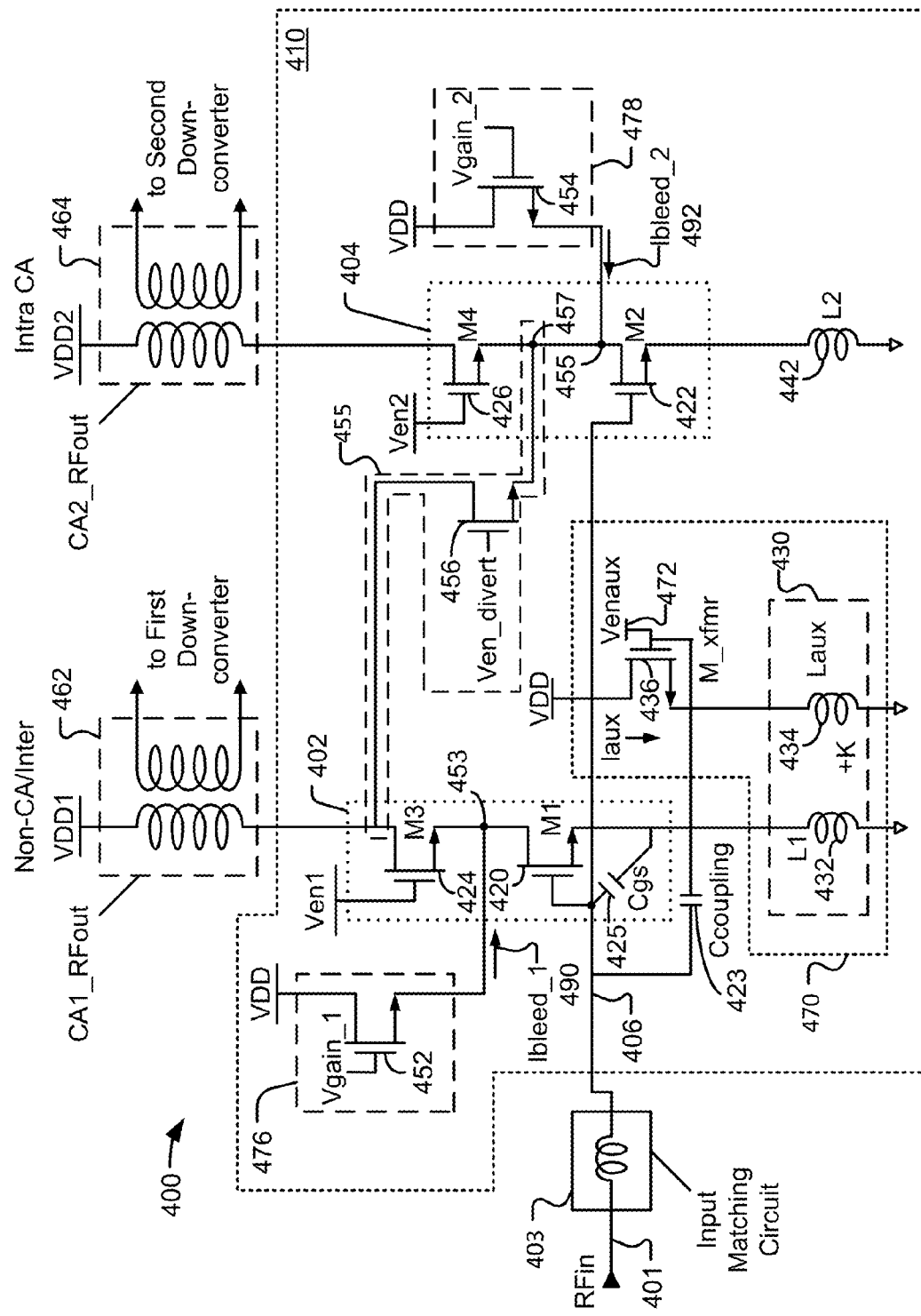
FIG. 4 illustrates an exemplary embodiment of an LNA and a transformer circuit that may be included in the wireless device of FIG. 1.

Wireless device 110 may include an amplifier having multiple DC-coupled amplification stages that have independently controllable gains, such as described in further detail with respect to FIG. 4. In a carrier aggregation mode of operation, the wireless device 110 may amplify different carrier signals at different amplifier stages. In a non-carrier aggregation mode of operation, the wireless device 110 may amplify a carrier signal at multiple amplifier stages that operate in parallel with each other. Because the gains of the multiple amplifier stages are independently controllable, the wireless device 110 may provide improved performance while processing carrier signals having different energy levels, such as carrier signals that are received from different base stations and/or from different wireless networks. The wireless device 110 may support various carrier aggregation modes, such as inter-band and intra-band carrier aggregation, at a single amplifier that uses a single element matching network. As a result, a chip area and cost of the amplifier may be reduced as compared to amplifiers that use more complex matching networks and non-DC coupled amplification stages.

In general, carrier aggregation (CA) may be categorized into two types—intra-band CA and inter-band CA. Intra-band CA refers to operation on multiple carriers within the same band. Inter-band CA refers to operation on multiple carriers in different bands.

FIG. 2A is a graphical diagram showing a low-band group 210, a mid-band group 212, a high-band group 214, and an example of contiguous intra-band carrier-aggregation (CA). In the example shown in FIG. 2A, wireless device 110 is configured with four contiguous carriers 216-219 in low-band. Wireless device 110 may send and/or receive transmissions on the four contiguous carriers 216-219 within the same band group. The wireless device 110 may include an LNA that has a first amplification stage 202 and a second amplification stage 204. The first amplification stage 202 may be direct-current (DC) coupled to the second amplification stage 204. The amplification stages 202, 204 may receive an input RF signal that includes a first carrier signal corresponding to the first carrier 216 and a second carrier signal corresponding to the second carrier 217. The first amplification stage 202 is configured to amplify the first carrier signal and the second amplification stage 204 is configured to amplify the second carrier signal. The second amplification stage 202 operates in parallel with the first amplification stage 202. As a result, the wireless device 110 may amplify a first portion of a received signal, the first portion corresponding to the first carrier 216, concurrently with amplifying a second portion of the received signal, the second portion corresponding to the second carrier 217.

FIG. 2B is a graphical diagram showing an example of non-contiguous intra-band CA. In the example shown in FIG. 2B, wireless device 110 is configured to send and/or receive wireless communications using four non-contiguous carriers in one band in the low-band group 210. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured to send and/or receive wireless communications using four carriers in two bands 220, 222 in the low-band group 210. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured to send and/or receive wireless communications using four carriers in two bands in different band groups, which include two carriers in one band in the low-band group 210 and two carriers in another band in the mid-band group 212. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
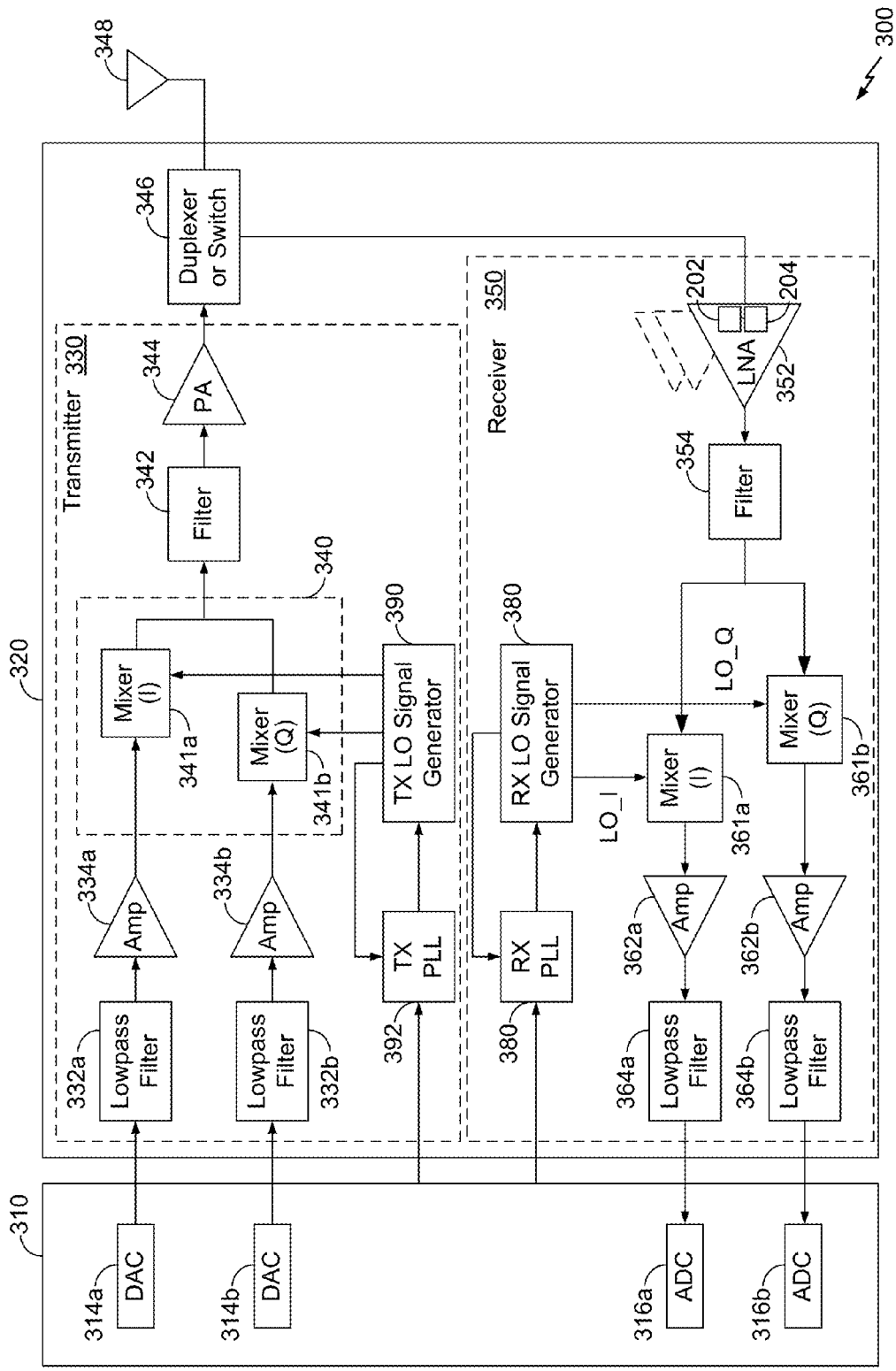
FIG. 3 is a block diagram showing components that may be included in the wireless device of FIG. 1.

FIG. 3 is a block diagram showing a wireless device 300 (e.g., an exemplary implementation of the wireless device 110 of FIG. 1). FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The LNA 352 may comprise a single LNA configured to operate on one or more carrier signals, either stand-alone or simultaneously. For example, the LNA 352 may include the first amplification stage 202 coupled in parallel with the second amplification stage 204 of FIG. 2. The LNA 352 may comprise two or more LNAs configured to operate on one or more carrier signals, either stand-alone or simultaneously.

The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310. The receiver 350 may include one or more additional sets of downconversion mixers, filters, and ADC's to process multiple signals that may be output from the LNA 352 (e.g., in a carrier aggregation operating mode).

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers.

Figure 2:
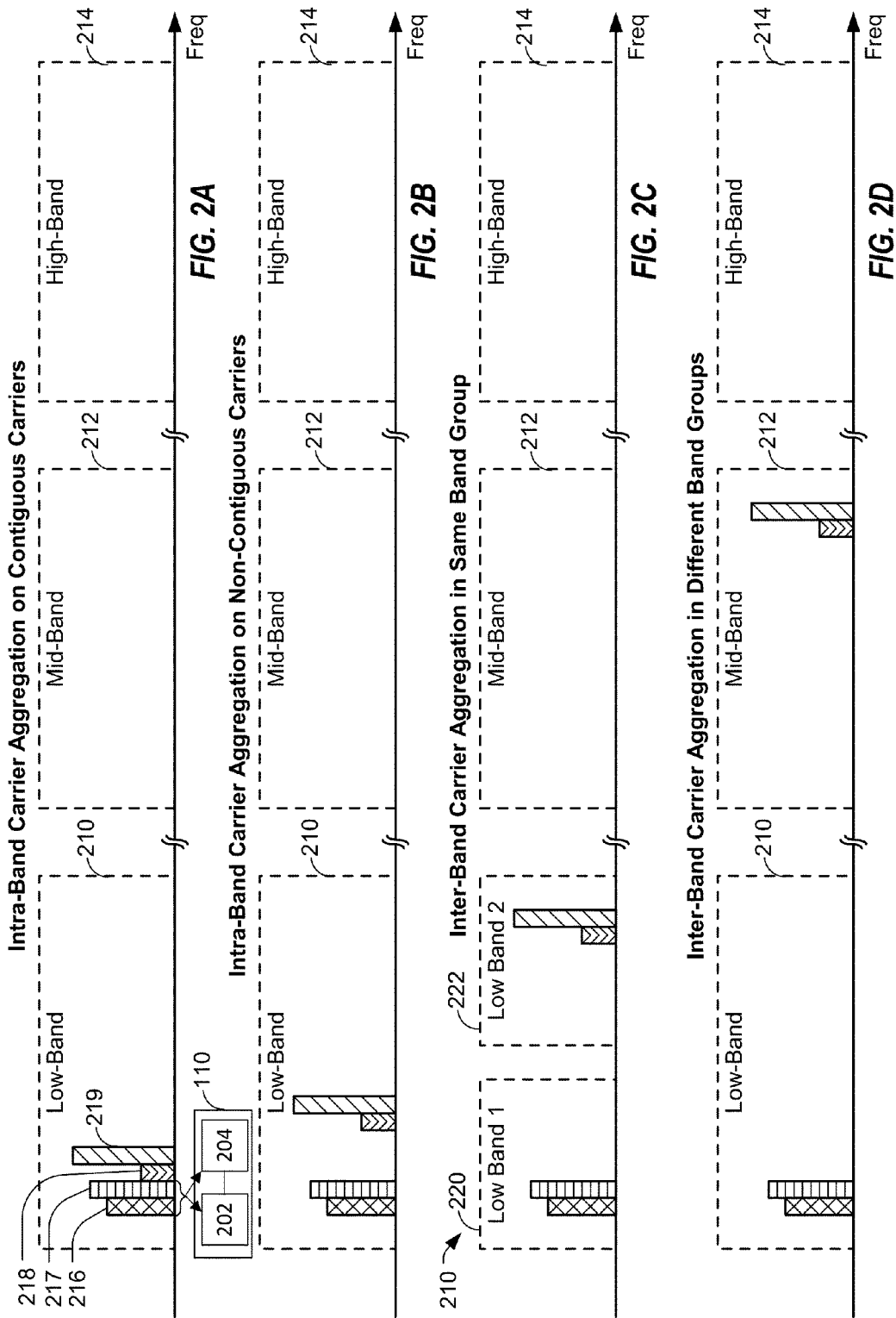
FIG. 2A is a graphical diagram showing an example of contiguous intra-band carrier-aggregation (CA) that may be used by the wireless device of FIG. 1.
FIG. 2B is a graphical diagram showing an example of non-contiguous intra-band CA that may be used by the wireless device of FIG. 1.
FIG. 2C is a graphical diagram showing an example of inter-band CA in the same band group that may be used by the wireless device of FIG. 1.
FIG. 2D is a graphical diagram showing an example of inter-band CA in different band groups that may be used by the wireless device of FIG. 1.

FIG. 4 illustrates an exemplary embodiment of an LNA and transformer circuit 400 that may be incorporated in a wireless device, such as the wireless device 110 of FIGS. 1-2. An LNA 410 may correspond to the LNA 352 of FIG. 3. The LNA 410 includes a first amplification stage 402 that may correspond to the first amplification stage 202 of FIGS. 2-3. The LNA 410 also includes a second amplification stage 404 that may correspond to the second amplification stage 204 of FIGS. 2-3. In an intra-band carrier aggregation (intra-CA) mode of operation, the first amplification stage 402 and the second amplification stage 404 amplify different carrier components of an input signal and provide current to a first degeneration inductor 432 and to a second degeneration inductor 442, respectively, which contribute to an input impedance of the LNA 410. In a non-carrier aggregation (non-CA) or inter-band carrier aggregation (inter-CA) mode of operation, a divert path 455 enables the first amplification stage 402 and the second amplification stage 404 to amplify the same carrier component of the input signal. The divert path 455 includes a divert transistor 456 and provides a current path that enables current to pass through the second degeneration inductor 442 to provide input impedance matching in LNA modes of operation where a single output is provided (i.e., non-CA and inter-CA) and to allow the input impedance in non-CA and inter-CA modes to be very close to the input impedance in the intra-CA mode. For example, current through the second degeneration inductor 442 enables a resistive component of the input impedance in the intra-CA mode to match or nearly match a resistance component of the input impedance in the non-CA mode, although a reactance component of the input impedances may not match. As described below, a programmable transformer 430 in a programmable degeneration circuit 470 enables the input impedance in the intra-CA mode to be substantially the same as the input impedance in the non-CA mode.

The first amplification stage 402 that includes a first transistor (a first gain transistor (M1) 420) and a third transistor (a first cascode transistor (M3) 424) that are serially coupled between a first output of the first amplification stage 402 and a first inductor (L1) 432. The first gain transistor 420 may amplify input signal variations received at a gate of the first gain transistor 420 to generate variations of output current provided at the output of the first amplification stage 402. The second amplification stage 404 includes a second transistor (a second gain transistor (M2) 422) and a fourth transistor (a second cascode transistor (M4) 426) that are serially coupled between a second output of the second amplification stage 404 and a second inductor (L2) 442. The second gain transistor 422 may amplify input signal variations received at a gate of the second gain transistor 422 to generate variations of output current provided at the output of the second amplification stage 404.

The first amplification stage 402 is coupled in parallel to the second amplification stage 404. To illustrate, the gate of the first gain transistor 420 and the gate of the second gain transistor 422 are coupled to an output of an input matching circuit so that both amplification stages 402, 404 receive substantially the same input signal at substantially the same time. The first amplification stage 402 may be coupled to a first load circuit that causes the first amplification stage 402 to have a first frequency response that attenuates components of the received input signal that are outside of the frequency range of a first carrier signal. The second amplification stage 404 may be coupled to a second load circuit that causes the second amplification stage 404 to have a second frequency response that attenuates components of the received input signal that are outside of the frequency range of a second carrier signal. Thus, the first amplifier stage 402 and the second amplifier stage 404 may amplify different components of a received signal.

The LNA 410 is configured to receive a radio frequency (RF) input signal (RF_in) over a connection 401 (e.g., from the duplexer or switch 346 of FIG. 3) through a single-element input matching network 403. In an exemplary embodiment, the single-element input matching network 403 may comprise an inductor. However, other matching circuitry may be implemented. The RF_in signal is provided over connection 406 to a gate of the first gain transistor 420 and the gate of the second gain transistor 422. The output of the input matching network 403 is DC coupled (i.e., without any intervening capacitors or inductors) to the gate of the first gain transistor 420 and to the gate of the second gain transistor 422. The gate of the first gain transistor 420 corresponds to an input of the first amplification stage 402 and is DC coupled to the gate of the second gain transistor 422. The gate of the second gain transistor 422 corresponds to an input of the second amplification stage 404.

The source of the first gain transistor 420 is coupled to a first degeneration inductor 432. The first degeneration inductor 432 provides source degeneration for the first gain transistor 420. The drain of the first gain transistor 420 is coupled to the source of a first cascode transistor 424. The first gain transistor 420 and the first cascode transistor 424 comprise the first amplification stage 402, such as the first amplification stage 202 of FIG. 2, that is configured to amplify a first carrier signal (e.g., a first LNA stage). The drain of the first cascode transistor 424 corresponds to an output of the first amplification stage 402 and is coupled to a first transformer 462. In an exemplary embodiment, the first transformer 462 is configured to convert a single ended CA1 RF output signal (CA1_RFout) from the drain of the first cascode transistor 424 to a differential signal output provided to a first downconverter (not shown).

The source of the second gain transistor 422 is coupled to a second degeneration inductor 442. The second degeneration inductor 442 provides source degeneration for the second gain transistor 422. The drain of the second gain transistor 422 is coupled to the source of a second cascode transistor 426. The second gain transistor 422 and the second cascode transistor 426 comprise the second amplification stage 404, such as the second amplification stage 204 of FIG. 2, that is configured to amplify a second carrier signal (e.g., a second LNA stage). The drain of the second cascode transistor 426 corresponds to an output of the second amplification stage 404 and is coupled to a second transformer 464. In an exemplary embodiment, the second transformer 464 is configured to convert a single ended CA2 RF output signal (CA2_RFout) from the drain of the second cascode transistor 426 to a differential signal output provided to a second downconverter (not shown).

To provide programmable source degeneration to the first gain transistor 420, the programmable degeneration circuit 470 includes the transformer 430 that includes an auxiliary inductor 434 proximate to the first degeneration inductor 432 such that the auxiliary inductor 434 is magnetically coupled to the first degeneration inductor 432. The auxiliary inductor 434 is coupled to the source of an auxiliary transistor 436. The drain of the auxiliary transistor 436 is coupled to a system voltage source and the gate of the auxiliary transistor 436 can be controlled by a DC control signal (Ven aux) to control the amount of current flowing through the auxiliary transistor 436, and accordingly, the amount of current flowing through the auxiliary inductor 434 (a "switched inductor" of the transformer 430). Activating the auxiliary transistor 436 causes a current to flow in an auxiliary path of the programmable degeneration circuit 470 that includes the auxiliary transistor 436 serially coupled to the switched auxiliary inductor 434. Activation of the switched inductor 434 affects the overall source degeneration provided to the first gain transistor 420 by the mutual coupling between the inductors 432 and 434. The gate of the auxiliary transistor 436 is also coupled to the RF_in signal on connection 406 through an AC coupling capacitance 423. The amount of current flowing through the auxiliary transistor 436 is determined by the DC voltage (Ven aux) applied via an auxiliary path enable input 472 to the gate of the auxiliary transistor 436. The current flowing through the auxiliary transistor 436 is related (e.g., proportional) to the current flowing through the auxiliary inductor 434.

In an exemplary embodiment, the coupling between the first degeneration inductor 432 and the auxiliary inductor 434 can be positive (+K). As described in further detail below, in an intra-CA mode the first amplification stage 402 and the second amplification stage 404 are coupled to separate load circuits, and in a non-carrier aggregation mode (non-CA mode) the first amplification stage 402 and the second amplification stage 404 are coupled to a same load circuit. Because first currents that flow in the first gain transistor 420 and the second gain transistor 422 in the intra-CA mode are larger than second currents that flow in the first gain transistor 420 and the second gain transistor 422 in the non-CA mode, an impedance at the input of the LNA 410 varies based on whether the LNA 410 is operating according to a CA mode or to a non-CA mode. Variation in the impedance affects the impedance matching of the single-element matching network 403. Therefore, if the auxiliary transistor 436 is turned ON in a non-CA mode, the inductive coupling (K) between the first degeneration inductor 432 and the auxiliary inductor 434 should be positive (+K) to preserve the input impedance matching.

In an exemplary embodiment, the auxiliary transistor 436 may be activated so that the source degeneration provided by the first degeneration inductor 432 may be controlled to modify the LNA input impedance in both non-CA mode and in CA mode to enable single-element matching in both modes. To illustrate, the input matching circuit 403 may include one or more components such as capacitors or inductors. Although multiple sets of components may be provided for each carrier band and/or each operating mode supported by the LNA 410, cost and area requirements may be reduced by using a single circuit element (e.g., a single inductor or a capacitor) in the input matching circuit 403. Rather than modifying the components of the input matching circuit 403 when an input impedance of the LNA changes, the programmable degeneration circuit 470 may be used to modify the input impedance. The separate gain transistors 420 and 422 can be referred to as a "split gm" architecture to support operation in a CA mode and in a non-CA mode. Although FIG. 4 depicts the programmable degeneration circuit 470 coupled to first amplification stage 402 and the second source degeneration inductor 442 coupled to the second amplification stage 404, in other implementations the programmable degeneration circuit 470 may be included in the first amplification stage 402 and the second source degeneration inductor 442 may be included in the second amplification stage 404.

In an exemplary embodiment, the divert path 455 including the divert transistor 456 is coupled to the first amplification stage 402 and coupled to the second amplification stage 404. The divert transistor 456 is configured to selectively divert current in the second amplification stage 404 to the first amplification stage 402. For example, a control signal (Ven_divert) may be applied to the gate of the divert transistor 456 to enable current flow through the divert transistor 456, providing a current path between the output of the first cascode transistor 424 and the output of the second gain transistor 422. Because the input matching circuit 403 may be "tuned" to match the input impedance of the LNA when both amplification stages 402 and 404 are active and both degeneration inductors 432, 442 receive current, diverting some current through the divert transistor 456 to flow through the second source degeneration inductor 442 improves input impedance matching in a non-CA mode as compared to having no current flow through the second source degeneration inductor 442. The drain of the divert transistor 456 can be coupled to the drain of the first cascode transistor 424. The source of the divert transistor 456 can be coupled to a node 457 between the drain of the second gain transistor 422 and the source of the second cascode transistor 426. The gate of the divert transistor 456 can be controlled by the control signal (Ven_divert), to enable and disable the divert transistor 456. In an exemplary embodiment, the divert transistor 456 can be configured, via the control signal (Ven_divert) to divert a portion of the current from the drain of the first cascode transistor 424 to the drain of the first gain transistor 422 so that a current flows through the second degeneration inductor 442 in a non-CA or inter-CA mode to help maintain the input impedance of the LNA 410 to allow single-element input matching.

The LNA 410 includes first circuitry 476 coupled to the first amplification stage 402 and configured to control a first gain of the first amplification stage 402. The first circuitry 476 comprises a first gain control transistor (a first "bleed" transistor) 452 configured to selectively divert a first bleed current Ibleed_1 490 from the first amplification stage 402 responsive to an adjustable control signal Vgain_1 at the gate of the first bleed transistor 452. Diverting the first bleed current 490 reduces an amount of current at the output of the first amplifier stage 402. As used herein, the "gain" of the first amplification stage 402 corresponds to a ratio of current provided at the output of the first amplification stage 402 as compared to an amplitude of a signal at the input of the first amplification stage 402. Bleeding current away from the output of the first amplification stage 402 via the first bleed transistor 452 reduces a gain of the first amplification stage 402. The LNA 410 also includes second circuitry 478 coupled to the second amplification stage 404 and configured to control a second gain of the second amplification stage 404 independently of the first gain of the first amplification stage 402. The second circuitry 478 includes a second gain control transistor (a second "bleed" transistor) 454 configured to selectively divert a second bleed current Ibleed_2 492 from the second amplification stage 404 responsive to an adjustable control signal Vgain_2 at the gate of the second bleed transistor 454. The LNA 410 may therefore be configured to provide different gain levels to the respective CA1 output of the cascode transistor 424 and the CA2 output of the cascode transistor 426. The source of the first bleed transistor 452 is coupled to a node 453 between the drain of the first gain transistor 420 and the source of the first cascode transistor 424. The source of the second bleed transistor 454 is coupled to a node 455 between the drain of the second gain transistor 422 and the source of the second cascode transistor 426.

When operating in a non-CA mode or an inter-CA mode where an output is provided to either the first transformer 462 or the second transformer 464, the first gain transistor 420 is on, the second gain transistor 422 is on, the first cascode transistor 424 is on and the second cascode transistor 426 is off. The second gain transistor 422 remains on in non-CA mode or in inter-CA mode to preserve the input matching. The divert transistor 456 may be turned on to divert a portion of the current from the output of the first cascode transistor 424 through the second gain transistor 422 and the second degeneration inductor 442 so that current passing through the second degeneration inductor 442 helps to preserve the input matching in LNA modes of operation where a single output is provided (i.e., non-CA and inter-CA) and to allow the input impedance in non-CA and inter-CA modes to be substantially the same as the input impedance in intra-CA mode.

In this exemplary embodiment, the auxiliary transistor 436 is also turned on so that a current flows in the auxiliary inductor 434. Current flowing in the auxiliary inductor 434 causes magnetic coupling to occur between the auxiliary inductor 434 and the first degeneration inductor 432, thus altering a first degeneration inductance provided to the first gain transistor 420 in non-CA or inter-CA modes.

When operating in an intra-CA mode where an output is simultaneously provided to both the first transformer 462 and the second transformer 464, the first gain transistor 420 is on, the second gain transistor 422 is on, the first cascode transistor 424 is on and the second cascode transistor 426 is on. In this exemplary embodiment, the current through the first gain transistor 420 and the second gain transistor 422 is higher than the current through the first gain transistor 420 in non-CA or inter-CA modes. In intra-CA mode where current flows through the first gain transistor 420 and the second gain transistor 422, consistent input matching, gain balance and noise figure maintenance is achieved for the first gain transistor 420 and the second gain transistor 422 by the divert transistor 456 being turned off to block current from the output of the first cascode transistor 424 to the output of the second gain transistor 422 and to the second degeneration inductor 442. In this exemplary embodiment, the auxiliary transistor 436 is also turned off so that no current flows in the auxiliary inductor 434 in an intra-CA mode. Accordingly, in this exemplary embodiment, a second degeneration inductance (differing from the first degeneration inductance that is provided when the auxiliary transistor 436 is turned on) that is provided by the first source degeneration inductor 432 to the first gain transistor 420, in addition to the source degeneration provided by the second source degeneration inductor 442 to the second gain transistor 422, provides sufficient source degeneration to achieve acceptable noise figure performance.

In an exemplary embodiment, in both non-CA/inter-CA and intra-CA modes of operation, the transistors 452 and the transistor 454 can be used to control the gain applied to the respective outputs of the first cascode transistor 424 and the second cascode transistor 426. When the transistor 452 is turned on by a control signal applied to its gate, a portion of the current at the output of the first gain transistor 420 at node 453 can be removed and caused to flow as the first bleed current 490 through the transistor 452 to the voltage source Vdd. Similarly, when the transistor 454 is turned on by a control signal applied to its gate, a portion of the current at the output of the second gain transistor 422 at node 455 can be removed and caused to flow as the second bleed current 492 through the transistor 454 as a current to the voltage source Vdd. In this manner, the gain applied to the CA1_RFout signal can be adjusted independently of the gain applied to the CA2_RFout signal so that the gain of CA1_RFout and CA2_RFout can be independently controlled. The ability to independently adjust the gain applied by the two amplifier stages 402, 404 allows the LNA 410 to concurrently amplify two different carriers that may be received from two different base stations and that may therefore have different power levels.

Controlling the amount of current that can be removed from the output of the first gain transistor 420 and from the output of the second gain transistor 422 can be accomplished using a number of different methodologies including, for example only, a digitally controlled and programmable circuit, or an analog control circuit.

A capacitor (Cgs) 425 (e.g., an internal or "on-chip" capacitor) may be provided coupling the gate of the first gain transistor 420 to its source. In an exemplary embodiment, the capacitance of Cgs 425 may be made configurable to provide for improved input matching of the LNA 410 to the input signal RFin. For example, Cgs 425 may be programmed to a first value in a first frequency band and to a second value in a second frequency band.

The LNA 410 may therefore support non-CA, inter-CA, and intra-CA modes of operation without adjusting components of the input matching circuit 403. The divert transistor 456 and the programmable degeneration circuit 470 enable input impedance values to be adjusted for input matching based on whether the LNA 410 operates in an intra-CA mode or in a non-CA or inter-CA mode. In addition, the independently controllable gains that are applied by the first amplification stage 402 and the second amplification stage 404 enable the LNA 410 to amplify carriers from different base stations and/or different wireless networks that may have different energy levels.

Figure 5:
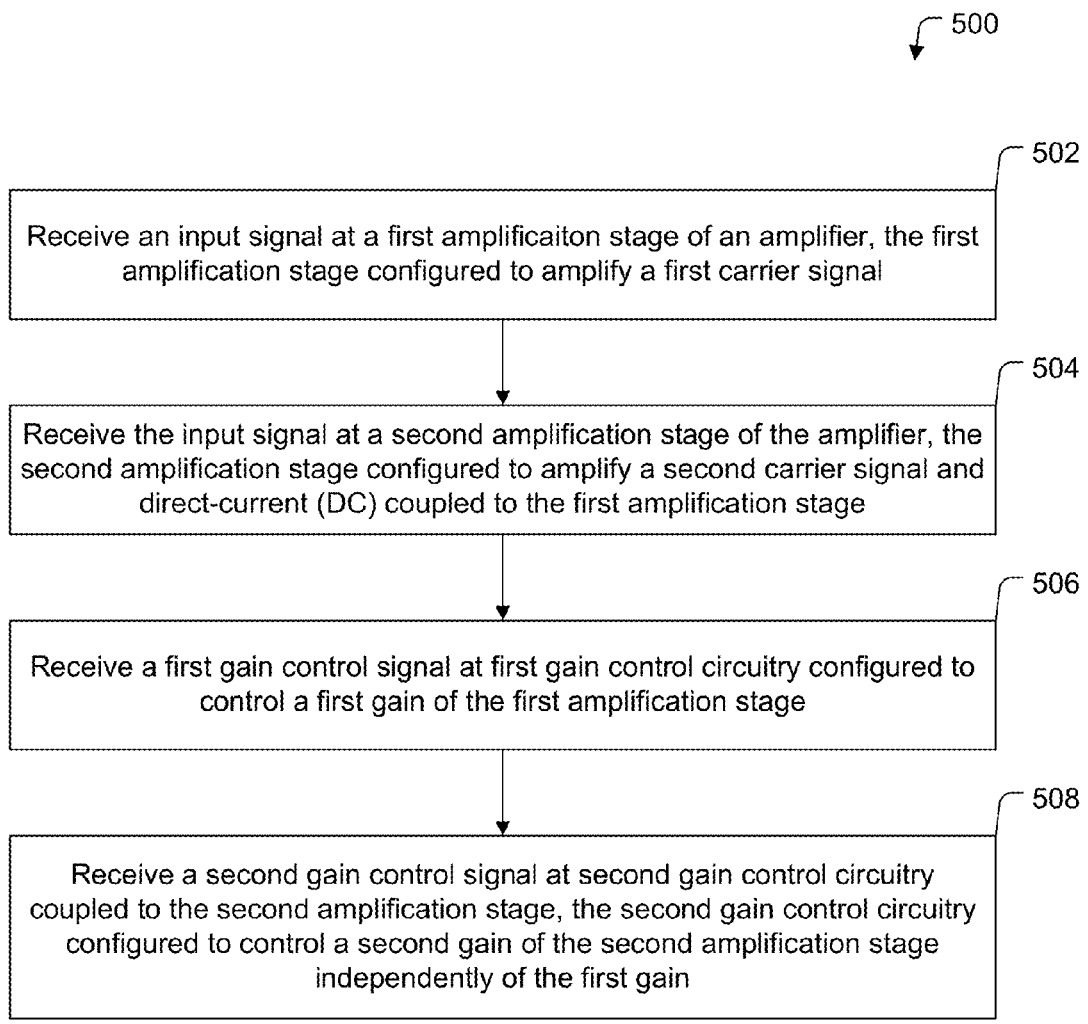
FIG. 5 illustrates an exemplary embodiment of a method that may be performed in the wireless device of FIG. 1.

Referring to FIG. 5, an exemplary embodiment of a method is depicted and generally designated 500. The method 500 may be performed in a wireless device that includes an amplifier with multiple amplification stages, such as the wireless device 110 of FIG. 1 that includes the LNA 410 of FIG. 4. For example, the method 500 may be performed by the LNA 410 of FIG. 4.

An input signal is received at a first amplification stage of an amplifier, the first amplification stage configured to amplify a first carrier signal, at 502. For example, the input signal may be an RF signal received at the gate of the first gain transistor 420 of FIG. 4 via the input matching circuit 403. To illustrate, the RF signal may be received from the antenna 348 of FIG. 3 via the duplexer or switch 346.

The input signal is received at a second amplification stage of the amplifier, the second amplification stage configured to amplify a second carrier signal, at 504. For example, the input signal may be received at the gate of the second gain transistor 422 via the input matching circuit 403. The second amplification stage is direct-current (DC) coupled to the first amplification stage, such as the second amplification stage 404 of FIG. 4 that is DC coupled to the first amplification stage 402.

A first gain control signal is received at first gain control circuitry configured to control a first gain of the first amplification stage, at 506. For example, a first gain control voltage may be applied to the gate of the first bleed transistor 452 of FIG. 4. A second gain control signal is received at second gain control circuitry coupled to the second amplification stage and configured to control a second gain of the second amplification stage independently of the first gain, at 508. For example, a second gain control voltage may be applied to the gate of the second bleed transistor 454 of FIG. 4. The first gain control voltage and the second gain control voltage may be selected, generated, or otherwise provided by a control circuit, such as by the data processor 310 of FIG. 3, based on a mode of operation of the amplifier (e.g., an intra-CA mode that uses different gains for carriers from different base stations).

The method 500 may also include providing a divert control signal to a divert transistor coupled to the first amplification stage and coupled to the second amplification stage. For example, in a non-CA operating mode, the divert enable signal Ven_divert may be applied to the gate of the divert transistor 456 of FIG. 4 to divert current from the second amplification stage 404 to the first amplification stage 402.

The method 500 enables operation of multiple amplification stages that are DC coupled and that may each provide an independently controllable gain level to its respective carrier signal. In addition to a non-carrier aggregation mode, various carrier aggregation modes, such as inter-band and intra-band carrier aggregation, may therefore be supported using a single amplifier that uses a single element matching network. As a result, a chip area and cost of the amplifier may be reduced as compared to amplifiers that use more complex matching networks and non-DC coupled amplification stages.

Although FIG. 5 depicts a particular order of elements of the method 500, it should be understood that, in other embodiments, elements of the method 500 may be performed in another order. In addition, two or more (or all) of the elements of the method 500 may be performed simultaneously or substantially simultaneously. For example, the input signal may be provided to the first amplification stage (at 502) simultaneously with (or substantially simultaneously with) being provided to the second amplification stage (at 504). As another example, the first gain control signal and the second gain control signal may be applied to the respective gain control circuitry at substantially the same time.

In conjunction with the disclosed embodiments, an apparatus is described that includes first means for amplifying a first carrier signal. For example, the first means for amplifying the first carrier signal may include the first amplification stage 202 of FIG. 2 or FIG. 3, the first amplification stage 402 of FIG. 4, another amplification gain stage circuit, or any combination thereof.

The apparatus also include second means for amplifying a second carrier signal, and the first means for amplifying is direct-current (DC) coupled to the second means for amplifying. For example, the second means for amplifying the second carrier signal may include the second amplification stage 204 of FIG. 2 or FIG. 3, the second amplification stage 404 of FIG. 4, another amplification gain stage circuit, or any combination thereof. DC coupling may include a conductive coupling between components without intervening reactance-providing components, such as inductors or capacitors.

The apparatus includes first means for controlling a first gain of the first means for amplifying. The first means for controlling the first gain may be configured to selectively divert a first bleed current from a first output of the first means for amplifying. For example, the first means for controlling the first gain may include the first circuitry 476 of FIG. 4, the first bleed transistor 452 of FIG. 4, another gain control circuit, or any combination thereof.

The apparatus also includes second means for controlling a second gain of the second stage independently of the first gain. The second means for controlling the second gain may be configured to selectively divert a second bleed current from a second output of the second means for amplifying. For example, the second means for controlling the second gain may include the second circuitry 478 of FIG. 4, the second bleed transistor 454 of FIG. 4, another gain control circuit, or any combination thereof.

In a particular embodiment, the apparatus includes means for diverting current from the second means for amplifying to the first means for amplifying. For example, the means for diverting current may include the divert transistor 456, another switch or circuit configured to divert current between amplification stages, or any combination thereof.

In a particular embodiment, the first means for amplifying includes means for providing a degeneration impedance. For example, the means for providing the degeneration impedance may include an auxiliary path that includes a switched inductor of a transformer. To illustrate, the means for providing the degeneration impedance may include the programmable degeneration circuit 470 of FIG. 4, another adjustable impedance circuit, or any combination thereof.

The low noise amplifier (LNA) with single-element input matching and dual gain control described herein may be implemented on one or more ICs, analog ICs, RFICs, mixed-signal ICs, ASICs, printed circuit boards (PCBs), electronic devices, etc. The LNA with single-element input matching and dual gain control may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNA with single-element input matching and dual gain control described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. In an exemplary embodiment, a storage device stores data in a form that is not a transient or propagating signal, such as based on an optical reflectivity or magnetic orientation of a physical storage material, an amount of charge stored on a floating gate of a transistor or on a plate of a capacitor, etc. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. To illustrate, the data processor 310 of FIG. 3 may execute program instructions to select values of the gain control signals Vgain_1 and Vgain_2 and to control the divert control signal Ven_divert of FIG. 4. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon.

Although selected aspects have been illustrated and described in detail, it will be understood that various substitutions and alterations may be made therein without departing from the spirit and scope of the present invention, as defined by the following claims.

What is claimed is:

1. An apparatus comprising:
   a first amplification stage configured to amplify a first carrier signal;
   a second amplification stage configured to amplify a second carrier signal, the first amplification stage direct-current (DC) coupled to the second amplification stage;
   first circuitry coupled to the first amplification stage and configured to control a first gain of the first amplification stage, the first circuitry configured to selectively divert a first bleed current from a first output of the first amplification stage; and
   second circuitry coupled to the second amplification stage and configured to control a second gain of the second amplification stage independently of the first gain, the second circuitry configured to selectively divert a second bleed current from a second output of the second amplification stage.

2. The apparatus of claim 1, further comprising a divert path coupled to the first amplification stage and coupled to the second amplification stage.

3. The apparatus of claim 2, wherein the divert path comprises a transistor configured to selectively divert current from the second amplification stage to the first amplification stage.

4. The apparatus of claim 1, wherein the first amplification stage is coupled to a programmable degeneration circuit.

5. The apparatus of claim 4, wherein the programmable degeneration circuit includes a transformer, and wherein the programmable degeneration circuit includes an auxiliary path that includes a switched inductor of the transformer.

6. The apparatus of claim 5, wherein the auxiliary path includes an auxiliary transistor serially coupled to the switched inductor, and wherein a gate of the auxiliary transistor is coupled to an auxiliary path enable input.

7. The apparatus of claim 1, wherein the first amplification stage includes a first gain transistor and a first cascode transistor, and wherein the second amplification stage includes a second gain transistor and a second cascode transistor.

8. The apparatus of claim 7, wherein the second cascode transistor is configured to be deactivated in a non-carrier aggregation mode and is configured to be activated in an intra-band carrier aggregation mode.

9. The apparatus of claim 7, wherein a divert transistor coupled to the second gain transistor and to the first cascode transistor is configured to be active in a non-carrier aggregation mode and is configured to be inactivate in an intra-band carrier aggregation mode.

10. The apparatus of claim 7, wherein a programmable degeneration circuit coupled to the first amplification stage includes a switched inductor, wherein the switched inductor is configured to be active in a non-carrier aggregation mode and is configured to be inactive in an intra-band carrier aggregation mode.

11. The apparatus of claim 1, wherein the first amplification stage is coupled in parallel to the second amplification stage.

12. The apparatus of claim 1, wherein an input of the first amplification stage is direct-current (DC) coupled to an input of the second amplification stage.

13. The apparatus of claim 1, wherein the first circuitry comprises a first gain control transistor configured to selectively divert the first bleed current from the first output of the first amplification stage, and wherein the second circuitry comprises a second gain control transistor configured to selectively divert the second bleed current from the second output of the second amplification stage.

14. An apparatus comprising:
    first means for amplifying a first carrier signal;
    second means for amplifying a second carrier signal, the first means for amplifying being direct-current (DC) coupled to the second means for amplifying;
    first means for controlling a first gain of the first means for amplifying and for selectively diverting a first bleed current from a first output of the first means for amplifying; and
    second means for controlling a second gain of the second means for amplifying independently of the first gain and for selectively diverting a second bleed current from a second output of the second means for amplifying.

15. The apparatus of claim 14, further comprising means for diverting current from the second means for amplifying to the first means for amplifying.

16. The apparatus of claim 14, further comprising means for providing a degeneration impedance, wherein the means for providing the degeneration impedance includes an auxiliary path that includes a switched inductor of a transformer.

17. The apparatus of claim 14, wherein a control input of the first means for amplifying is direct-current (DC) coupled to a control input of the second means for amplifying.

18. A method comprising:
    receiving an input signal at a first amplification stage of an amplifier, the first amplification stage configured to amplify a first carrier signal;
    receiving the input signal at a second amplification stage of the amplifier, the second amplification stage configured to amplify a second carrier signal, the second amplification stage direct-current (DC) coupled to the first amplification stage;
    receiving a first gain control signal at first gain control circuitry configured to control a first gain of the first amplification stage, the first gain control circuitry configured to selectively divert a first bleed current from a first output of the first amplification stage; and
    receiving a second gain control signal at second gain control circuitry coupled to the second amplification stage, the second gain control circuitry configured to control a second gain of the second amplification stage independently of the first gain, the second gain control circuitry configured to selectively divert a second bleed current from a second output of the second amplification stage.

19. The method of claim 18, further comprising providing a divert control signal to a divert transistor coupled to the first amplification stage and coupled to the second amplification stage.

20. The apparatus of claim 14, wherein the first means for controlling the first gain is coupled to the first means for amplifying, and wherein the second means for controlling the second gain is coupled to the second means for amplifying.

* * * * *